United States Patent
Lindsey, Jr.

(10) Patent No.: US 8,450,188 B1
(45) Date of Patent: May 28, 2013

(54) METHOD OF REMOVING BACK METAL FROM AN ETCHED SEMICONDUCTOR SCRIBE STREET

(75) Inventor: Paul C. Lindsey, Jr., Lafayette, CA (US)

(73) Assignee: Micro Processing Technology, Inc., Lafayette, CA (US)

( * ) Notice: Subject to any disclaimer, the term of this patent is extended or adjusted under 35 U.S.C. 154(b) by 161 days.

(21) Appl. No.: 13/136,459

(22) Filed: Aug. 2, 2011

(51) Int. Cl.
*H01L 21/00* (2006.01)

(52) U.S. Cl.
USPC .......................... 438/462; 438/464

(58) Field of Classification Search
USPC .................................. 438/462, 464
See application file for complete search history.

(56) References Cited

U.S. PATENT DOCUMENTS

| | | | |
|---|---|---|---|
| 5,501,893 A | 3/1996 | Laermer et al. | |
| 5,820,006 A * | 10/1998 | Turner | 225/96 |
| 6,025,251 A * | 2/2000 | Jakowetz et al. | 438/464 |
| 6,417,013 B1 | 7/2002 | Teixeira et al. | |
| 6,448,151 B2 * | 9/2002 | Tateishi | 438/458 |
| 6,680,241 B2 * | 1/2004 | Okamoto et al. | 438/464 |
| 6,790,709 B2 * | 9/2004 | Dias et al. | 438/122 |
| 6,826,840 B1 | 12/2004 | Lindsey et al. | |
| 6,902,944 B2 * | 6/2005 | Teshirogi et al. | 438/33 |
| 6,974,721 B2 * | 12/2005 | Koizumi et al. | 438/106 |
| 7,052,975 B2 * | 5/2006 | Koizumi | 438/460 |
| 7,642,175 B1 * | 1/2010 | Patwardhan et al. | 438/464 |
| 7,674,689 B2 * | 3/2010 | Schneegans et al. | 438/462 |
| 7,767,554 B2 * | 8/2010 | Arita et al. | 438/462 |
| 7,772,020 B2 * | 8/2010 | Yoo | 438/29 |
| 7,858,512 B2 * | 12/2010 | Marcoux | 438/612 |
| 7,927,985 B2 * | 4/2011 | Tanaka et al. | 438/507 |
| 7,989,313 B2 * | 8/2011 | Wang et al. | 438/458 |
| 8,143,105 B2 * | 3/2012 | Barber et al. | 438/113 |
| 8,222,120 B2 * | 7/2012 | Chun et al. | 438/462 |
| 2005/0186760 A1 * | 8/2005 | Hashimura et al. | 438/460 |
| 2005/0221587 A1 * | 10/2005 | Teshirogi et al. | 438/464 |
| 2005/0221588 A1 * | 10/2005 | Teshirogi et al. | 438/464 |
| 2005/0221589 A1 * | 10/2005 | Teshirogi et al. | 438/464 |
| 2006/0079024 A1 * | 4/2006 | Akram | 438/110 |
| 2006/0205182 A1 * | 9/2006 | Soejima | 438/460 |
| 2006/0223234 A1 * | 10/2006 | Terayama et al. | 438/113 |
| 2007/0111390 A1 * | 5/2007 | Komura et al. | 438/113 |
| 2007/0221944 A1 * | 9/2007 | Cheol Yoo | 257/99 |
| 2007/0293021 A1 * | 12/2007 | Yoshikawa | 438/463 |
| 2008/0064187 A1 * | 3/2008 | Brown | 438/464 |
| 2008/0286948 A1 * | 11/2008 | Miyazaki et al. | 438/464 |
| 2009/0194880 A1 * | 8/2009 | Feng et al. | 257/771 |
| 2009/0209088 A1 * | 8/2009 | Nagasawa | 438/462 |
| 2010/0048001 A1 * | 2/2010 | Harikai et al. | 438/464 |
| 2011/0057332 A1 * | 3/2011 | Iwami | 257/783 |
| 2011/0175209 A1 * | 7/2011 | Seddon et al. | 257/659 |
| 2011/0217813 A1 * | 9/2011 | Wang | 438/113 |
| 2011/0312115 A1 * | 12/2011 | Kato | 438/33 |
| 2012/0104359 A1 * | 5/2012 | Felker et al. | 257/14 |

* cited by examiner

*Primary Examiner* — Kimberly Rizkallah
*Assistant Examiner* — Caleb Henry
(74) *Attorney, Agent, or Firm* — Thomas R. Lampe

(57) ABSTRACT

A method of dividing a semiconductor wafer having a metal layer and a semiconductor material layer including the step of cutting the semiconductor material layer along scribe streets without cutting the metal layer, turning over the wafer, and cutting the metal layer along the scribe streets.

17 Claims, 3 Drawing Sheets

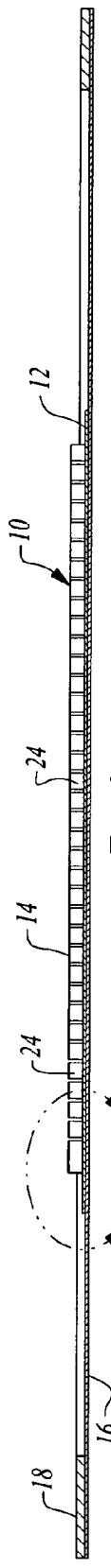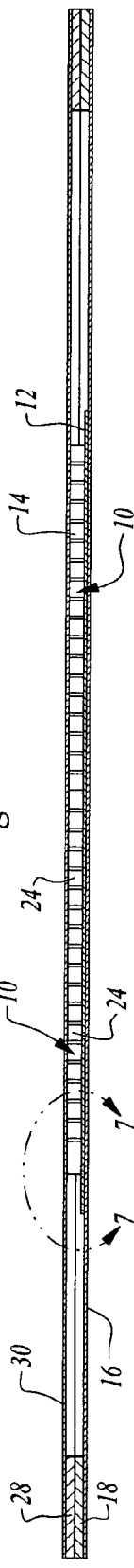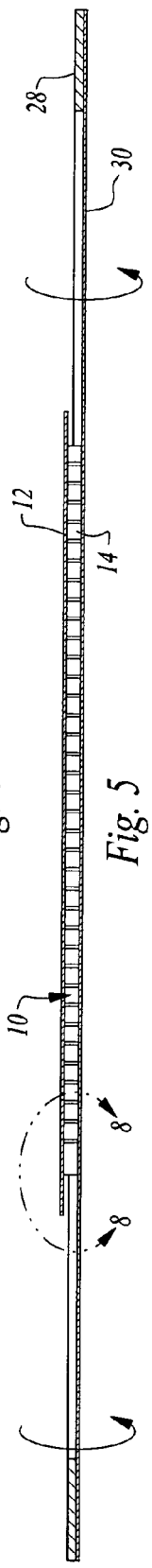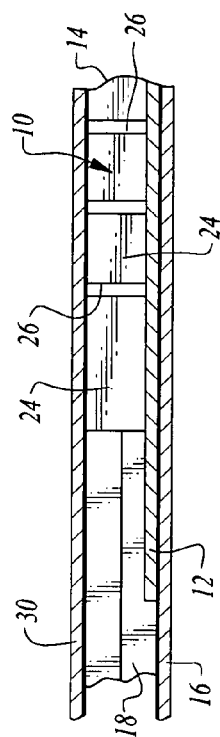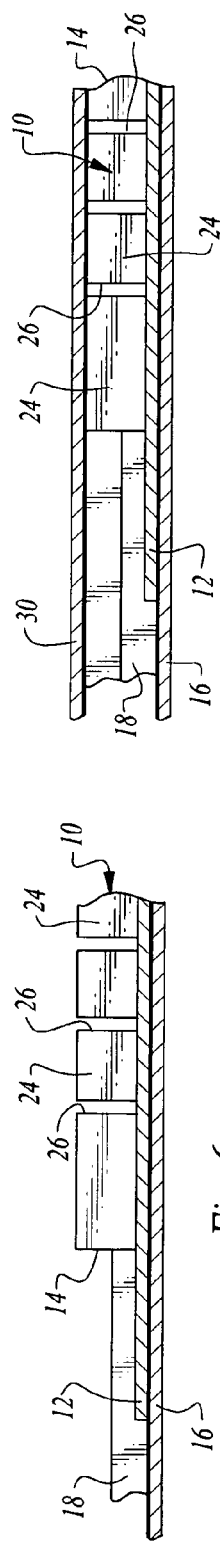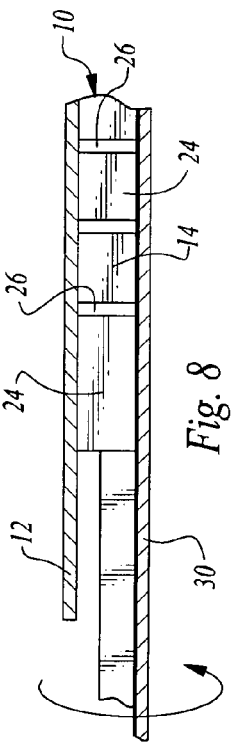

METHOD OF REMOVING BACK METAL FROM AN ETCHED SEMICONDUCTOR SCRIBE STREET

TECHNICAL FIELD

This invention relates to a method of separating semiconductor devices from a semiconductor wafer.

BACKGROUND OF THE INVENTION

In the past, numerous different methods have been used for singulating or dicing a semiconductor wafer, the process of dividing a semiconductor wafer into individual devices. The two most widely used methods at this time are sawing using a diamond saw blade and laser scribing, using a focused laser beam to cut through the wafer. Neither method is ideal. Both result in a significant loss of material during the cutting process. As the size of semiconductor devices get smaller, the width of the line of lost material during the scribing process becomes comparable to the width of the device. If the width of the line of material lost during the scribing process could be made significantly smaller, many more devices could be made on each wafer, resulting in a large savings in the cost of fabricating the devices. In addition, both sawing and laser scribing cause damage along the cut edges of the devices that can result in rejected devices during visual inspection and in some cases cracking that can cause device failure in the field.

Since the invention of plasma and reactive ion etching in the 1970s, many have proposed using these processes for wafer singulation. These processes potentially could decrease the material loss during the dicing process by etching very narrow scribe lines through the semiconductor wafer. In addition, since the etch process takes place at a microscopic level and involves no heat or mechanical grinding, the edges of the semiconductor devices are not damaged by the process. In order for a plasma etching or a reactive ion etching process to be effective in wafer dicing, it would have to etch very deep, narrow trenches in the scribe streets of the semiconductor wafer and it would have to etch at a very fast etch rate to be economically attractive. These two conditions have been achieved in the last several years by employing the teachings of Teixeira, et al. (U.S. Pat. No. 6,417,013) building on the work of Laermer, et al. (U.S. Pat. No. 5,501,893). An issue that remains to be resolved is a cost effective method of removing the back metal that remains in the scribe street after the etch process is completed.

Semiconductor wafers usually have one or more metal layers applied to the back of the wafer during fabrication to provide ohmic contact and/or ease of die attach during packaging of the devices. These layers of metal are not readily etched using dry etch processes.

DISCLOSURE OF INVENTION

This invention teaches a method of effectively removing these metal layers in the semiconductor wafer scribe streets.

More particularly, the method of the present invention is for dividing a semiconductor wafer having a metal layer attached to a semiconductor material layer and intersecting scribe streets into separate individual devices.

The wafer is mounted on a first support with the metal layer adhesively attached to the first support whereby the first support supports the wafer.

While the metal layer is adhesively attached to the first support, the semiconductor material in the scribe streets is removed to form individual semiconductor material dies, each incorporating a device, without removing the metal layer from the scribe streets.

The semiconductor material dies of the semiconductor material layer are adhesively attached to a second support.

While employing the second support to support the wafer, the first support is released from adhesive attachment to the metal layer and the first support removed from the metal layer to expose the metal layer.

While continuing to employ the second support to support the wafer, the metal layer is cut along the scribe streets.

The metal layer is a base layer and positioned underneath the semiconductor material layer when the wafer is supported by the first support. The method includes the step of turning the wafer upside down prior to the step of cutting the metal layer along the scribe streets to position the metal layer above the semiconductor material layer.

Other features, advantages and objects of the present invention will become apparent with reference to the following description and accompanying drawings.

BRIEF DESCRIPTION OF DRAWINGS

FIG. 3 is an enlarged, cross-sectional view taken along the line 3-3 of FIG. 1;

FIG. 4 is an enlarged, cross-sectional view illustrating the first and second frames illustrated in FIG. 2 in engagement and the plastic sheet surrounded by the first frame adhesively attached to the dies of the semiconductor material layer of the wafer;

FIG. 5 is a view similar to FIG. 4, but illustrating the wafer having been turned upside down so that the metal base is above the layer of semiconductor material and with the frame and plastic film formerly attached to the metal layer having been removed;

FIG. 6 is an enlarged, cross-sectional view of the structural portion defined by arrow headed line 6-6 of FIG. 3;

FIG. 7 is an enlarged, cross-sectional view of the structural portion defined by arrow headed line 7-7 of FIG. 4;

FIG. 8 is an enlarged, cross-sectional view of the structural portion defined by arrow headed line 8-8 of FIG. 5;

MODES FOR CARRYING OUT THE INVENTION

Figure 1:
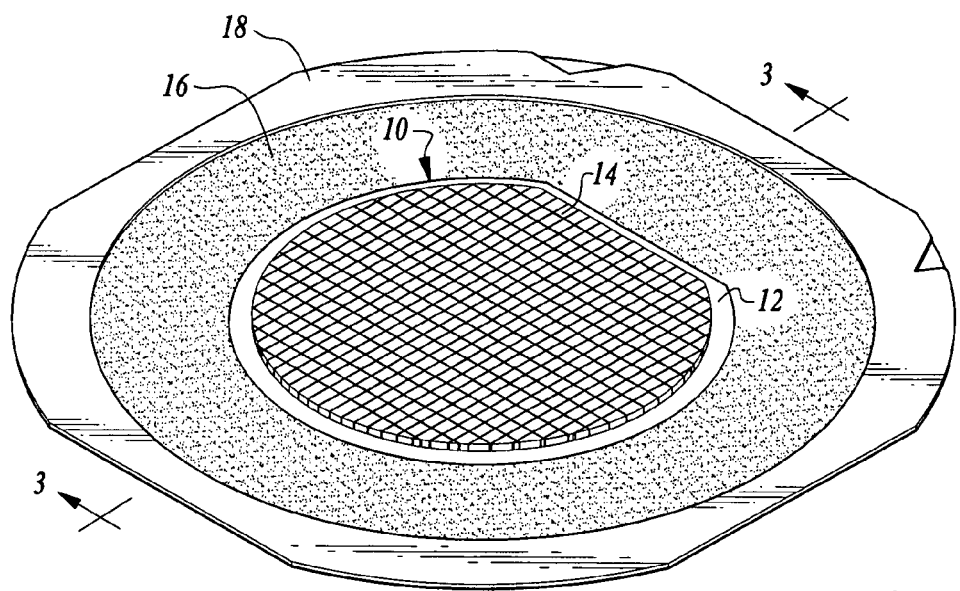
FIG. 1 is a top, perspective view illustrating a semiconductor wafer having a metal layer base adhesively secured to and supported by a plastic sheet surrounded by a frame and a semiconductor material layer which has been etched along scribe streets, the metal layer in the scribe streets not having been etched.
Figure 2:
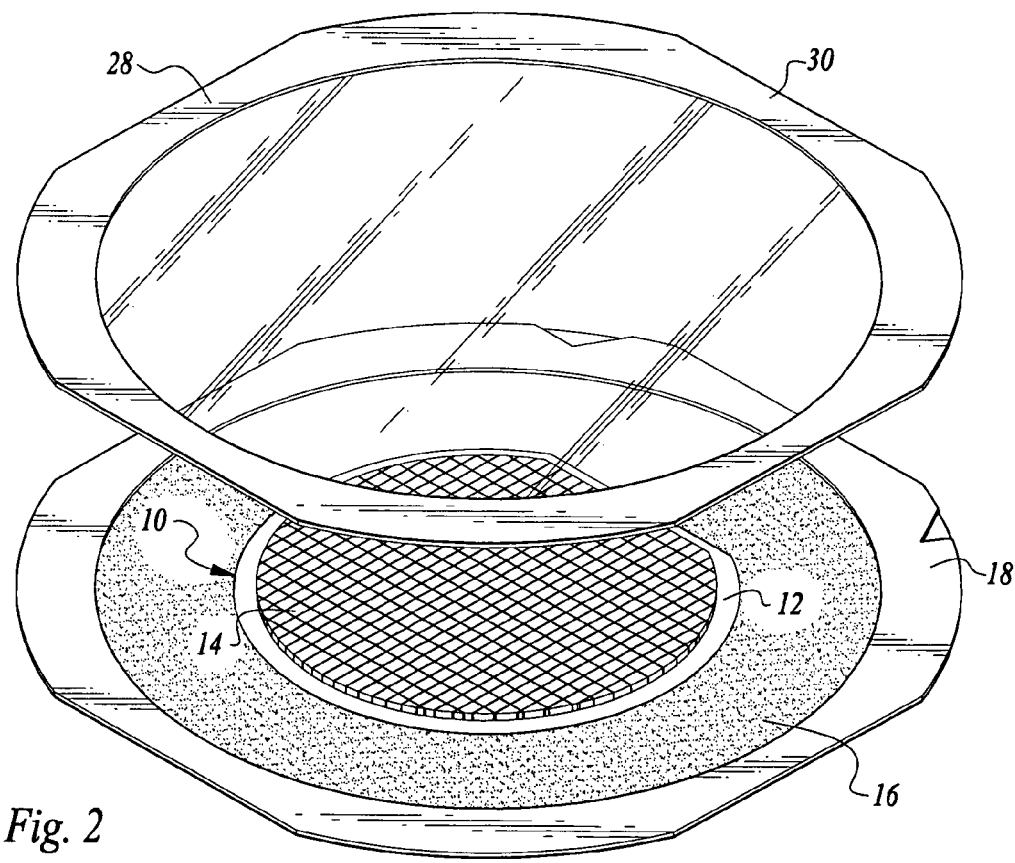
FIG. 2 is a top, perspective view illustrating a second plastic film and frame structure being lowered into position with respect to the wafer, plastic sheet and frame illustrated in FIG. 1.

Referring now to the drawings, a semiconductor wafer 10 is illustrated, the wafer having a metal layer or base 12 and a semiconductor material layer 14. The semiconductor material layer 14 of the wafer shown in FIGS. 1-8 has been etched along scribe streets to form individual semiconductor material dies but leaving the metal layer 12 intact, even in the scribe streets.

Figure 11:
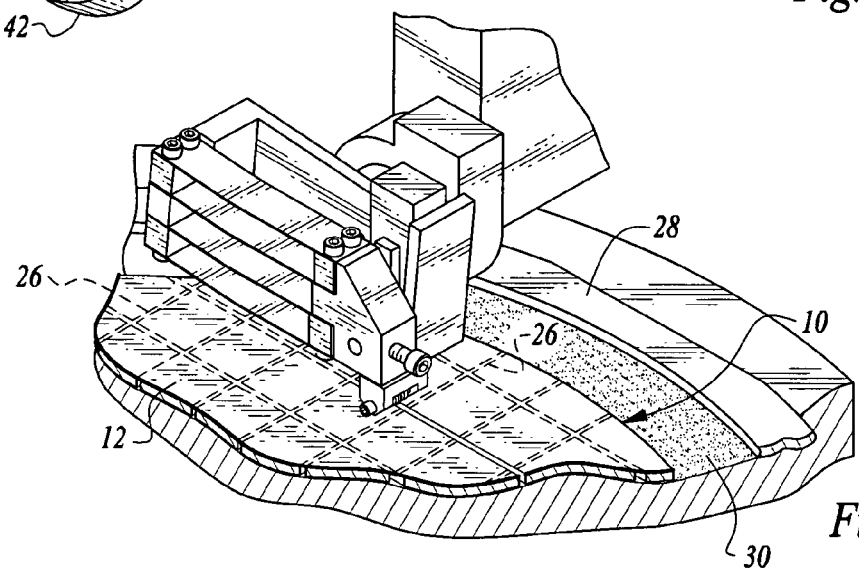
FIG. 11 is a perspective view of the cutter or etching head of a machine that may be utilized to etch the wafer.

A commercially available etching machine of any suitable type may be employed to etch the semiconductor material to remove semiconductor material in the scribe streets but leaving the metal unetched. That is, the etching process illustrated in FIG. 11 is continued in the normal fashion until the metal layer on the back side of the wafer is reached. U.S. Pat. No. 6,826,840, Lindsey, et al. discloses an apparatus that has the ability to align scribe streets with the direction of travel of a cutting tool, the ability to move a cutting tool rapidly the length of the scribe streets, and the ability to step precisely from scribe street to scribe street.

It is current practice to mount a semiconductor wafer to be diced or singulated on a plastic film that is stretched across a metal or plastic frame. The plastic film is usually coated with an adhesive layer that is released by exposure to ultra violet radiation.

In the arrangement illustrated, the metal layer 12 of the wafer 10 is adhesively attached to a plastic film 16 coated with an adhesive layer that is released by exposure to ultra violet radiation stretched on a frame 18. FIG. 1 shows the wafer, plastic film 16 and frame 18 removed from the etching or scribing machine after the above described scribing of the semiconductor material layer has been accomplished. The individual semiconductor material dies 24 are separated along intersecting scribe streets 26 extending across the wafer.

A second frame 28 is lowered into engagement with frame 18 and the plastic film 30 attached to frame 28, which is also coated with an adhesive layer that is released by exposure to ultra violet radiation, is adhesively attached to the semiconductor material dies 24. See FIGS. 4 and 7. The assembly thus created is then turned over (see FIGS. 5 and 8) and exposed to ultra violet radiation. This releases plastic film 16 from the wafer and exposes the outer surface of the metal layer 12, the condition shown in FIGS. 5 and 8. The removed plastic film 16 and associated frame 18 are then completely removed from the assembly. Since the body of the wafer and the back metal layer 12 prevent the UV radiation from reaching the UV adhesive on plastic film 30, the wafer remains firmly attached to plastic film 30 at the outer surface of each die after film 16 and frame 18 are removed. The back metal layer 12 is now easily accessed for further processing.

As illustrated in FIG. 11, the wafer 10, film 30 and frame 28 are then placed on an apparatus of the type disclosed, for example, by Lindsey, et al. (U.S. Pat. No. 6,826,840) that has the ability to align the scribe streets with the direction of travel of a cutting tool, the ability to move a cutting tool rapidly the length of the scribe streets, and the ability to step precisely from scribe street to scribe street.

To perform the back metal removal process, the direction of travel of a cutting tool is aligned to a scribe street etched in the semiconductor material and is drawn through the thin back metal layer along the length of the scribe street from one side of the wafer to the other side. The cutting tool's vertical position during the cutting process is determined by first touching the top of the metal surface at a position away from the scribe street and using that vertical position as a reference to lower the tool so that the blade of the tool penetrates completely through the metal layer. After the cutting tool is moved completely across the wafer and beyond its edge, the system steps the cutting tool to the next scribe street and the cutting tool is moved in the opposite direction back across the wafer while cutting through the metal layer in this direction. This process continues until all of the scribe streets have been cleared of metal in the first direction then the wafer is rotated 90 degrees and the process is repeated in the second direction.

The cutting tool used in the process of removing the back metal layer in the etched scribe streets is made from a hard material, such as tungsten carbide or carbon steel, that can be honed to a sharp edge. The tool is shaped so that the leading edge of the tool is above the level of the top of the metal layer surface as the tool is moved across the wafer and the tool edge penetrates through the metal layer along its length. The tool has a raised edge on each end so that it can cut through the metal layer while traveling in either direction.

Figure 9:
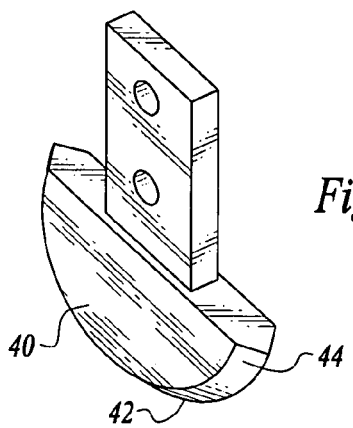
FIG. 9 is a perspective view of one form of cutting tool which may be employed to cut the metal layer of the wafer.
Figure 10:
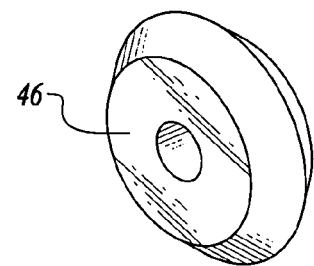
FIG. 10 is a perspective view of an alternative form of cutting tool which may be employed to cut the metal layer of the wafer.

FIG. 9 illustrates one suitable form of cutting tool 40 in the form of a non-rotatable blade having a sharp edge 42 with a leading edge portion 44 positioned above the outer surface of the metal layer during the cutting operation. The shape of the tool results in no abrupt edges or corners on the tool that might catch on the corner of a die and cause it to be damaged or displaced from its position as the cutting tool passes. An alternate cutting tool is a wheel 46 (FIG. 10) with the entire periphery thereof honed to a sharp edge, wheel 46 having the characteristics described above of a leading cutting edge and a trailing cutting edge higher than the cutting edge near the middle of the tool.

Figure 12:
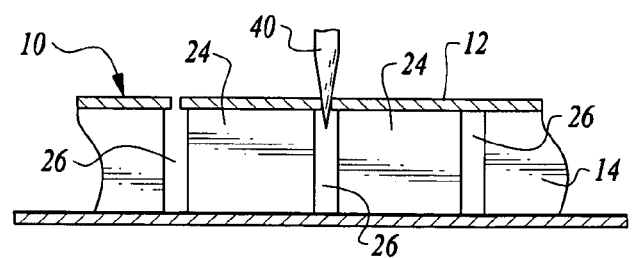
FIG. 12 is an enlarged cross-sectional view illustrating use of a cutting tool to pierce and cut a wafer metal base at a scribe street.
Figure 13:
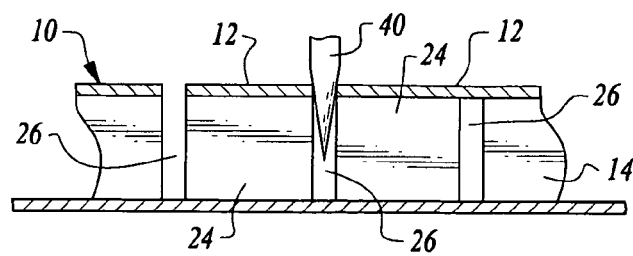
FIG. 13 is a view similar to FIG. 12, but illustrating an alternative cutting tool configuration.

Depending on the characteristics of the metal layer on the back of the semiconductor wafer, the mode of cutting incorporated in the use of the tool may vary. If the metal layer is composed of a brittle material, the tool is positioned in the etched scribe street to a depth such that the tool penetrates completely through the metal layer but is not intentionally made to touch the sides or top of the etched scribe street (FIG. 12). If the metal layer is composed of a ductile metal, the tool is pressed using a constant force against the corner formed by the top of the wafer and side edge of the etched scribe street as the tool is moved across the wafer in the scribe street (FIG. 13). The force placed on the tool is chosen such that it is sufficient to shear the metal at this edge but not so large that it causes damage to the edge of the semiconductor device.

In an alternate embodiment of the invention, rather than removing all semiconductor material from a scribe street to fully expose the metal layer in the scribe street, a thin connector portion 50 of semiconductor material is left after the semiconductor material layer etching step described above is completed. This thin connector portion of semiconductor material helps to maintain the proper spacing between the dies when they are inverted and attached to the second UV film. The remaining semiconductor portion should be thin enough so as to not impede the cutting of the metal layer by the cutting tool.

After the metal has been cut in the scribe streets in both directions, another film (not shown) is mounted on a frame. The new film is placed so that it comes in contact with the bottom side of the wafer and the adhesive firmly attaches the bottom side of the wafer to this film. This film is chosen for its properties that allow the film to be stretched or expanded to allow the spacing between the die to be increased. The assembly is then turned over and exposed to ultraviolet radiation, releasing the wafer from the first UV film and frame. The semiconductor wafer, mounted face up on the new frame and film, is now ready for a pick-and-place operation.

The invention claimed is:

1. A method of dividing a semiconductor wafer having a metal layer attached to a semiconductor material layer and intersecting scribe streets into separate individual devices, said method comprising the steps of:

mounting the wafer on a first support with the metal layer adhesively attached to said first support whereby said first support supports said wafer;

while said metal layer is adhesively attached to said first support, removing substantially all the semiconductor material in the scribe streets to form individual semiconductor material dies, each incorporating a device, without removing the metal layer from the scribe streets;

adhesively attaching the semiconductor material dies of said semiconductor material layer to a second support;

while employing said second support to support said wafer, releasing said first support from adhesive attachment to said metal layer and removing said first support from said metal layer to expose the metal layer; and while continuing to employ said second support to support said wafer, cutting said metal layer along said scribe streets.

2. The method according to claim 1 wherein said metal layer is a base layer and positioned underneath said semiconductor material layer when said wafer is supported by said first support, said method including the step of turning said wafer upside down prior to the step of cutting said metal layer along said scribe streets to position the metal layer above said semiconductor material layer.

3. The method according to claim 2 wherein said first support and said second support each comprise plastic film.

4. The method according to claim 3 wherein said first support and said second support additionally comprise frames attached to and surrounding said plastic film.

5. The method according to claim 3 wherein said plastic film is coated with adhesive providing an adhesive layer which is rendered substantially non-adhesive when exposed to UV radiation.

6. The method according to claim 5 including the step of exposing the plastic film of said first support to UV radiation to release the plastic film of said first support from adhesive attachment to said metal layer.

7. The method according to claim 6 including the step of utilizing the body of the wafer and the metal layer to prevent the UV radiation used to release the plastic film of said first support from adhesive attachment to said metal layer from reaching the adhesive of the plastic film of the second support whereby the plastic film of the second support remains adhesively attached to said semiconductor material dies.

8. The method according to claim 1 wherein the step of cutting said metal layer along the scribe streets comprises aligning a cutting tool with each of said scribe streets, engaging the cutting tool with said metal layer, and moving the cutting tool along each of said scribe streets while penetrating the metal in said scribe streets.

9. The method according to claim 8 wherein said cutting tool is moved completely across the wafer and beyond the edges of said wafer.

10. The method according to claim 9 wherein said cutting tool is made of a hard material having a sharp edge, said sharp edge having a leading edge portion positioned at a level above the outer surface of the metal layer, said sharp edge completely passing through the metal layer along the length of the metal layer at each scribe street.

11. The method according to claim 1 wherein the metal layer in the scribe streets is completely exposed by removal of the semiconductor material from the scribe streets.

12. The method according to claim 8 wherein said cutting tool comprises a non-rotatable blade having a curved, outer cutting edge.

13. The method according to claim 8 wherein said cutting tool is a rotating wheel having the entire periphery thereof honed to a sharp edge.

14. The method according to claim 8 wherein said metal layer is a brittle material and wherein said cutting tool is substantially completely prevented from touching the semiconductor material at the sides or top of the scribe streets when cutting the metal layer.

15. The method according to claim 8 wherein said metal layer is ductile and wherein said cutting tool is pressed using a constant force against corners formed at the die edges as the cutting tool moves along the scribe streets.

16. A method of dividing a semiconductor wafer having a metal layer attached to a semiconductor material layer and intersecting scribe streets into separate individual devices, said method comprising the steps of:

mounting the wafer on a first support with the metal layer adhesively attached to said first support whereby said first support supports said wafer;

while said metal layer is adhesively attached to said first support, removing all or a substantial portion of semiconductor material in the scribe streets to form individual semiconductor material dies, each incorporating a device, without removing the metal layer from the scribe streets;

adhesively attaching the semiconductor material dies of said semiconductor material layer to a second support;

while employing said second support to support said wafer, releasing said first support from adhesive attachment to said metal layer and removing said first support from said metal layer to expose the metal layer; and while continuing to employ said second support to support said wafer, cutting said metal layer along said scribe streets, the amount of any semiconductor material remaining in said scribe streets after removal of a substantial portion thereof being insufficient to impede cutting of said metal layer.

17. A method of dividing a semiconductor wafer having a metal layer attached to a semiconductor material layer and intersecting scribe streets into separate individual devices, said method comprising the steps of:

while said metal layer is attached to a first support, removing all or substantially all of the semiconductor material in the scribe streets to form individual semiconductor material dies, each incorporating a device, without removing the metal layer from the scribe streets;

turning over said wafer; and while employing a second support to support said overturned wafer, cutting said metal layer along said scribe streets.

* * * * *